United States Patent
Camargo

(10) Patent No.: US 9,799,539 B2
(45) Date of Patent: Oct. 24, 2017

(54) METHOD AND APPARATUS FOR LIQUID TREATMENT OF WAFER SHAPED ARTICLES

(71) Applicant: LAM RESEARCH AG, Villach (AT)

(72) Inventor: Francisco Camargo, Villach (AT)

(73) Assignee: LAM RESEARCH AG, Villach (AT)

( * ) Notice: Subject to any disclaimer, the term of this patent is extended or adjusted under 35 U.S.C. 154(b) by 460 days.

(21) Appl. No.: 14/305,900

(22) Filed: Jun. 16, 2014

(65) Prior Publication Data
US 2015/0364345 A1    Dec. 17, 2015

(51) Int. Cl.
*H01L 21/67* (2006.01)
*F16K 23/00* (2006.01)

(52) U.S. Cl.
CPC ........ *H01L 21/67051* (2013.01); *F16K 23/00* (2013.01)

(58) Field of Classification Search
CPC ................................................ H01L 21/67051
See application file for complete search history.

(56) References Cited

U.S. PATENT DOCUMENTS

| 4,877,160 A | 10/1989 | Derving |
| 4,903,717 A | 2/1990 | Sumnitsch |
| 5,573,033 A | 11/1996 | Litzel |
| 7,607,459 B2 | 10/2009 | Treen, Jr. |
| 2014/0144464 A1* | 5/2014 | Kaneko ............ H01L 21/67046 134/4 |

FOREIGN PATENT DOCUMENTS

WO    2010/045583    4/2010

\* cited by examiner

*Primary Examiner* — Jason Ko

(57) ABSTRACT

In an apparatus for treating a wafer-shaped article, a spin chuck is provided for holding and rotating a wafer-shaped article. A liquid dispenser comprises a check valve positioned so as to prevent process liquid from dripping out of a discharge nozzle of the liquid dispenser. A valve seat of the check valve is at a distance in a range of 20 mm to 100 mm from an outlet opening of said discharge nozzle.

7 Claims, 2 Drawing Sheets

METHOD AND APPARATUS FOR LIQUID TREATMENT OF WAFER SHAPED ARTICLES

BACKGROUND OF THE INVENTION

1. Field of the Invention

The invention relates to a method and apparatus for liquid treatment of wafer-shaped articles.

2. Description of Related Art

Liquid treatment includes both wet etching and wet cleaning, wherein the surface area of a wafer to be treated is wetted with a treatment liquid and a layer of the wafer is thereby removed or impurities are thereby carried off. A device for liquid treatment is described in U.S. Pat. No. 4,903,717. In this device the distribution of the liquid may be assisted by the rotational motion imparted to the wafer.

Techniques for etching and cleaning a surface of a disc-shaped article are typically used in the semiconductor industry after cleaning a silicon wafer during production processes (e.g. pre-photo clean, post CMP-cleaning, and post plasma cleaning). However, such methods may be applied for other plate-like articles such as compact discs, photo masks, reticles, magnetic discs or flat panel displays. When used in semiconductor industry it may also be applied for glass substrates (e.g. in silicon-on-insulator processes), III-V substrates (e.g. GaAs) or any other substrate or carrier used for producing integrated circuits.

Single wafer tools such as that described in U.S. Pat. No. 4,903,717 are required to meet more stringent processing conditions as the size of the device features formed on the semiconductor wafer continues to decrease, and as the aspect ratio of those device features continues to increase. Furthermore, the changeover to wafers of larger diameters means that the economic loss associated with a damaged wafer becomes greater. For example, the area of the incoming 450 mm diameter standard silicon wafer is 125% greater than that of the outgoing 300 mm diameter standard silicon wafer, which itself was 125% greater than that of the preceding generation 200 mm diameter standard silicon wafer.

SUMMARY OF THE INVENTION

The present invention is based in part on the recognition by the present inventor that stray droplets from the liquid dispensers utilized in processing equipment of the type described above, can result in significant damage to the workpiece and a higher loss of workpieces. The inventor evaluated various techniques in an effort to address this problem before discovering the efficacy of the techniques described herein.

Thus, in one aspect, the present invention relates to an apparatus for treating a wafer-shaped article, comprising a spin chuck for holding and rotating a wafer-shaped article. A liquid dispenser is connected to a supply of a process liquid and is positioned or positionable so as to dispense the process liquid onto a surface of a wafer-shaped article when positioned on the spin chuck. The liquid dispenser comprises a check valve positioned so as to prevent process liquid from dripping out of a discharge nozzle of the liquid dispenser. A valve seat of the check valve is at a distance in a range of 20 mm to 100 mm from an outlet opening of the discharge nozzle. A control valve is provided for turning on and off the supply of process liquid to the liquid dispenser, the control valve being positioned upstream of the check valve.

In preferred embodiments of the apparatus according to the present invention, the control valve is positioned at least 50 cm, and preferably at least 100 cm, upstream of the check valve.

In preferred embodiments of the apparatus according to the present invention, the check valve is urged toward a closed position by a spring.

In preferred embodiments of the apparatus according to the present invention, the check valve is configured to be opened by supply pressure of the process liquid bearing on a side of a valve element of the check valve that is opposite the spring.

In preferred embodiments of the apparatus according to the present invention, the check valve is an in-line check valve in which the spring is positioned downstream of the valve element.

In preferred embodiments of the apparatus according to the present invention, the liquid dispenser comprises a generally inverted U-shaped dispensing arm in which the discharge nozzle depends downwardly toward the spin chuck, the check valve being in a downwardly-depending section of the dispensing arm.

In preferred embodiments of the apparatus according to the present invention, the check valve is configured to close upon turning off the supply of process liquid to the liquid dispenser.

In another aspect, the present invention relates to a liquid dispenser assembly for use in an apparatus for treating a wafer-shaped article, comprising a liquid dispenser arm configured to be connected to a supply of a process liquid and to be positioned so as to dispense process liquid onto a surface of a wafer-shaped article. A check valve is positioned in or adjacent the liquid dispenser arm so as to prevent process liquid from dripping out of a discharge nozzle of the liquid dispenser arm. A valve seat of the check valve is at a distance in a range of 20 mm to 100 mm from an outlet opening of the discharge nozzle.

In preferred embodiments of the liquid dispenser assembly according to the present invention, the check valve is urged toward a closed position by a spring.

In preferred embodiments of the liquid dispenser assembly according to the present invention, the check valve is configured to be opened by supply pressure of process liquid bearing on a side of a valve element of the check valve that is opposite the spring.

In preferred embodiments of the liquid dispenser assembly according to the present invention, the check valve is an in-line check valve in which the spring is positioned downstream of the valve element.

In preferred embodiments of the liquid dispenser assembly according to the present invention, the check valve is a lift check valve in which the spring urges a piston valve element toward a closed position, along a direction that is generally perpendicular to an overall direction of process liquid through the liquid dispenser assembly.

In preferred embodiments of the liquid dispenser assembly according to the present invention, the liquid dispenser assembly comprises a generally inverted U-shaped dispensing arm in which the discharge nozzle depends downwardly, the check valve being in a downwardly-depending section of the dispensing arm.

In yet another aspect, the present invention relates to a nozzle assembly for use in an apparatus for treating a wafer-shaped article, comprising a nozzle body having a discharge outlet. A check valve is positioned in the nozzle body upstream of the discharge outlet so as to prevent process liquid from dripping out of the discharge outlet. A valve seat of the check valve is at a distance in a range of 20 mm to 100 mm from the discharge outlet.

In preferred embodiments of the nozzle assembly according to the present invention, the check valve is urged toward a closed position by a spring.

In preferred embodiments of the nozzle assembly according to the present invention, the check valve is configured to be opened by supply pressure of process liquid bearing on a side of a valve element of the check valve that is opposite the spring.

In preferred embodiments of the nozzle assembly according to the present invention, the check valve is an in-line check valve in which the spring is positioned downstream of the valve element.

In preferred embodiments of the nozzle assembly according to the present invention, the nozzle body comprises an upstream section that contains the check valve and a detachable downstream section that forms the discharge outlet.

In preferred embodiments of the nozzle assembly according to the present invention, a liquid inlet of the nozzle body has a diameter greater than a diameter of the discharge outlet. Preferably, the outlet has a cross-sectional area that is at least 5% smaller than the cross-sectional area of the inlet.

In preferred embodiments of the nozzle assembly according to the present invention, an upstream end of the nozzle body is configured to be attached to an inlet pipe, and wherein a downstream end of the nozzle body including the discharge outlet is not configured to be attached to any further pipe downstream of the discharge outlet.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
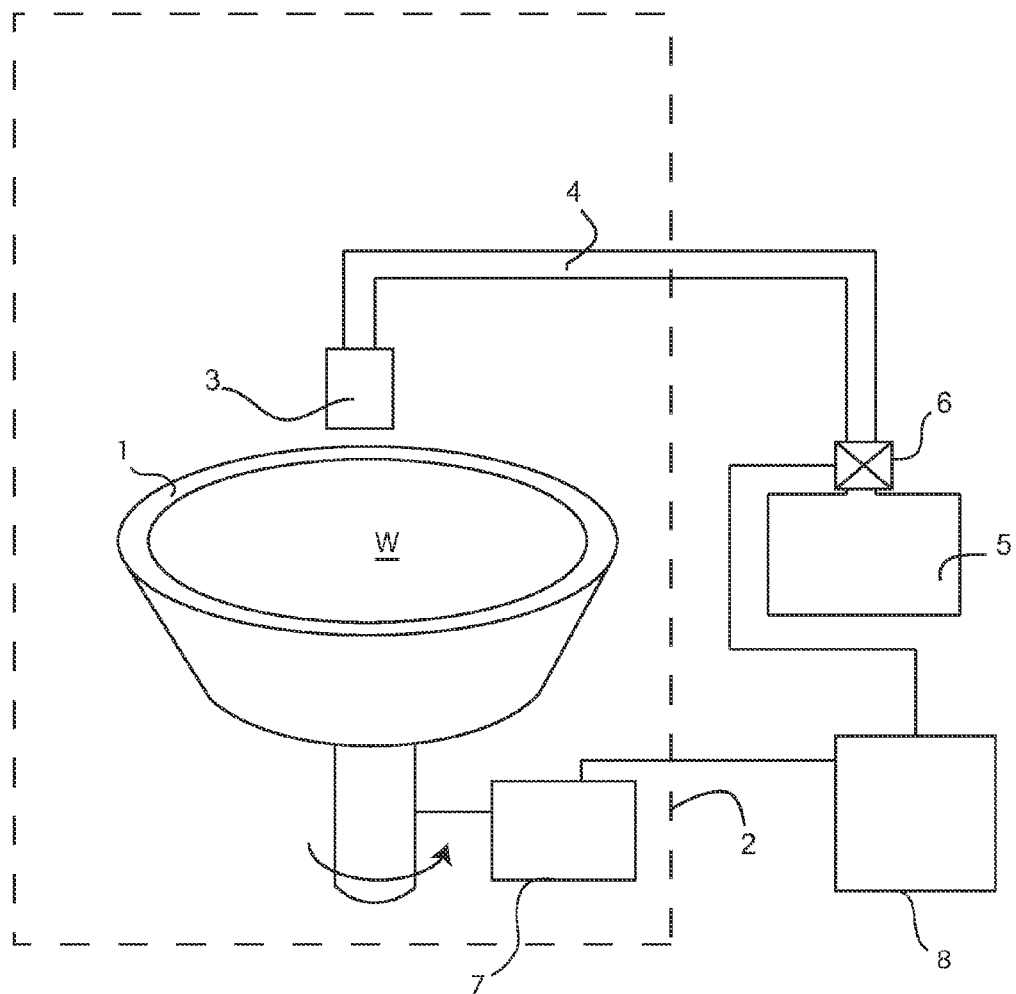
FIG. 1 is a schematic view of an apparatus according to a first embodiment of the invention.

Referring now to the drawings, FIG. 1 depicts a spin chuck 1 that holds a wafer W thereon in a predetermined orientation, which is preferably such that the major surfaces of disposed horizontally or within ±20° of horizontal. Spin chuck 1 may for example be a chuck that operates according to the Bernoulli principle, as described for example in U.S. Pat. No. 4,903,717. Alternatively, spin chuck 1 may comprise a series of gripping pins that can support the full weight of wafer W in use.

Chuck 1 is typically present in a process module for single wafer wet processing of semiconductor wafers, and may or may not be positioned within a chamber 2. A liquid dispenser assembly is positioned above the chuck 1, and comprises a liquid dispenser arm 4 that is connected to a supply 5 of a process liquid, via a control valve 6. The liquid dispenser arm 4 comprises a nozzle assembly 3 at its distal end. The liquid dispenser arm and nozzle assembly 3 are shown in use position above the wafer W positioned on spin chuck 1. However, the liquid arm is preferably pivotable or movable linearly to a standby position in which it does not overlie the wafer W, to facilitate loading and unloading of wafers W on the spin chuck 1.

Spin chuck 1 is rotated via a lower shaft that in turn is driven in rotation by a motor 7. A controller 8 controls the overall operation of the spin chuck 1, including coordinating the action of motor 7 to rotate the chuck and the action of valve 6 to open and close the flow of process liquid from the supply 5.

Figure 2:
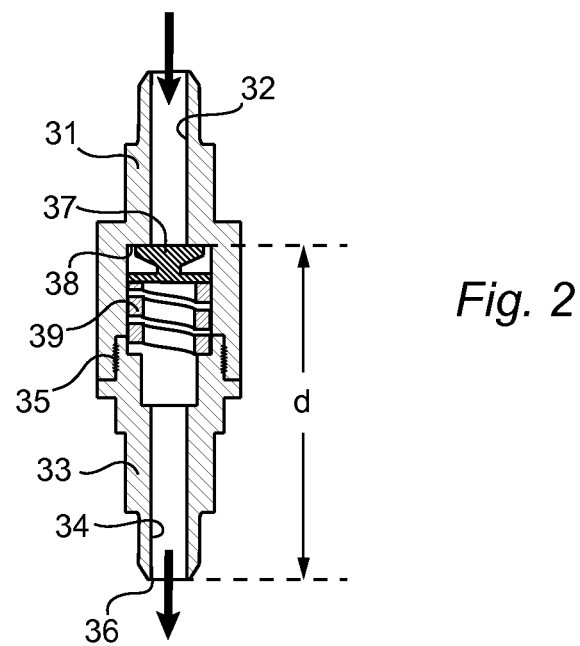
FIG. 2 is cross-sectional view of the nozzle assembly used in the apparatus of FIG. 1.

Turning now to FIG. 2, the nozzle assembly 3 of FIG. 1 in this embodiment comprises a nozzle body composed of an upstream body component 31 that is engaged with a downstream body component 33 via threading 35. A check valve is positioned within the nozzle assembly, and includes a valve element 37 that is urged toward a closed position against valve seat 38 by a helical spring 39. The valve seat 38 is formed integrally with the upstream body component 31, and each of the components 31, 33, 37 and 39 shown in FIG. 2 is preferably made of a chemically inert plastic material.

The valve seat 38 is positioned at a distance d from the outlet opening 36 of the nozzle, the distance d preferably being in a range of 20 mm to 100 mm.

Furthermore, the control valve 6 of FIG. 1 is positioned preferably at least 50 cm, and more preferably at least 100 cm, upstream of the check valve.

The inlet passage 32 formed in the upstream body component 31 preferably has a larger cross-sectional area than the outlet passage 34 formed in the downstream body component 33. Preferably, the cross-sectional area of the outlet passage 34 is at least 5% less than the cross-sectional area of the inlet passage 32.

Whereas the upstream end of component 31 is configured to be attached to an inlet pipe, the downstream end of component 33, which includes the discharge orifice 36, preferably is not configured to be attached to any further downstream pipe.

The detachable nature of the parts 31, 33 facilitates replacing the downstream component with one having a different diameter discharge outlet 36, to adapt the nozzle performance for process liquids of different viscosities. Alternatively, the entire nozzle assembly 3 is also readily detachable from dispenser arm 4.

In use, a wafer W is positioned on spin chuck 1 and controller 8 signals motor 7 to rotate the wafer at a selected rpm. Controller 8 next signals control valve 6 to open the supply 5 of process liquid to the dispenser arm 4.

As the process liquid enters into nozzle assembly 3 via the inlet 32 formed in the upstream body component 31, it then reaches the valve element 37, which until then had been in the closed position illustrated in FIG. 2. The supply pressure of the process liquid is sufficient in this embodiment to displace the valve element 37 downwardly, off of the valve seat 38, so that process liquid may continue to flow through the outlet passage 34 and be discharged through the nozzle orifice 36 onto the wafer W.

At the conclusion of the desired treatment of the wafer W with the process liquid, the controller 8 signals the control valve 6 to close. As the pressure of the process liquid in the nozzle assembly drops, the valve element 37 is urged by spring 39 so as to return to its closed position against valve seat 38.

Figure 3:
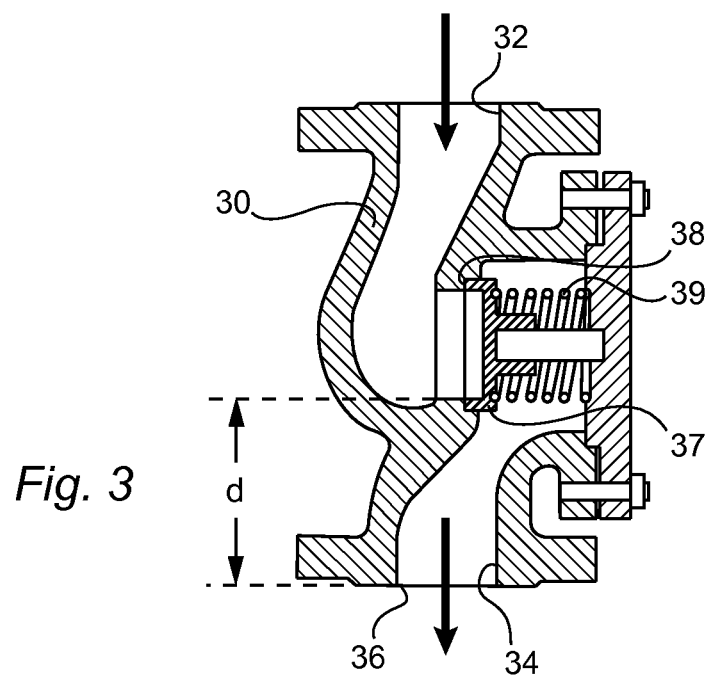
FIG. 3 is cross-sectional view of an alternative nozzle assembly suitable for use in the apparatus of FIG. 1.

In FIG. 3, an alternative construction of the nozzle assembly 3 is illustrated, in which the nozzle body 30 is configured such that the valve seat 38 is oriented generally perpendicular to the overall direction of flow. The distance d is again as described in connection with FIG. 2, and the check valve of this embodiment operates as described in connection with FIG. 2.

An apparatus, liquid dispenser assembly and nozzle assembly as described above have been found to address in a satisfactory way several previously unsolved problems in connection with processing of semiconductor wafers on single wafer tools. In particular, during processes especially with process liquids that have low surface tension, the process liquid tends to drip at the beginning and end of flow and when the dispenser arm moves to home position. Air also enters the chemical tubing due to the process liquid trickle due to gravity.

This can lead to defects on process wafers that result in loss of the wafer. The air that enters the tubing also poses a problem as the flow-on step creates uneven flow that promotes splashes due to a sputter effect.

Various techniques were explored in an effort to address these problems, including the use of suction to "suck back" the process liquid at the conclusion of processing, to prevent it from trickling out of the nozzle; the use of positive pressure to blow out excess process liquid from the nozzle; reducing the tube diameter so as to create increased internal surface tension; and positioning the controlled on/off valve near the outlet of the nozzle. However, none of those techniques adequately resolved the foregoing problems.

On the other hand, the apparatus, liquid dispenser assembly and nozzle assembly according to the present invention were found to solve the foregoing problems, as there is a check valve at the point of use that opens only when flow is allowed. The check valve closes immediately after flow stops and does not allow for the process liquid to drip during dispenser arm movement. A further benefit of the check valve as described herein is that air does not enter the dispenser arm after flow stops.

While the present invention has been described in connection with various preferred embodiments thereof, it is to be understood that those embodiments are provided solely to illustrate the invention, and should not be used as a pretext to limit the scope of protection conferred by the true scope and spirit of the appended claims.

What is claimed is:

1. Apparatus for treating a wafer-shaped article, comprising:
   a spin chuck for holding and rotating a wafer-shaped article;
   a liquid dispenser connected to a supply of a process liquid and positioned or positionable so as to dispense the process liquid onto a surface of a wafer-shaped article when positioned on the spin chuck;
   wherein the liquid dispenser comprises a check valve positioned so as to prevent process liquid from dripping out of a discharge nozzle of the liquid dispenser, a valve seat of said check valve being at a distance in a range of 20 mm to 100 mm from an outlet opening of said discharge nozzle, wherein said check valve and said valve seat comprise a chemically inert plastic material; and
   a control valve for turning on and off the supply of process liquid to the liquid dispenser, the control valve being positioned upstream of the check valve.

2. The apparatus according to claim 1, wherein the control valve is positioned at least 100 cm upstream of the check valve.

3. The apparatus according to claim 1, wherein the check valve is urged toward a closed position by a spring.

4. The apparatus according to claim 3, wherein the check valve is configured to be opened by supply pressure of the process liquid bearing on a side of a valve element of the check valve that is opposite the spring.

5. The apparatus according to claim 4, wherein the check valve is an in-line check valve in which said spring is positioned downstream of said valve element.

6. The apparatus according to claim 1, wherein said liquid dispenser comprises a generally inverted U-shaped dispensing arm in which the discharge nozzle depends downwardly toward the spin chuck, the check valve being in a downwardly-depending section of the dispensing arm.

7. The apparatus according to claim 1, wherein the check valve is configured to close upon turning off the supply of process liquid to the liquid dispenser.

* * * * *